(12) United States Patent
Araki

(10) Patent No.: US 6,950,486 B2
(45) Date of Patent: Sep. 27, 2005

(54) DELAY APPARATUS AND METHOD

(75) Inventor: Satoru Araki, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 898 days.

(21) Appl. No.: 09/808,941

(22) Filed: Mar. 16, 2001

(65) Prior Publication Data

US 2001/0022824 A1 Sep. 20, 2001

(30) Foreign Application Priority Data

Mar. 17, 2000 (JP) ............................. 2000/075834

(51) Int. Cl.$^7$ ................................................ H04L 7/02
(52) U.S. Cl. .................................... 375/360; 376/364
(58) Field of Search ........................... 375/354, 359, 375/360, 363, 364, 373, 286, 293, 294, 327, 355, 357, 368, 371, 376; 327/152, 156, 157, 172; 329/304, 307

(56) References Cited

U.S. PATENT DOCUMENTS

| | | | | |
|---|---|---|---|---|
| 5,220,201 A | * | 6/1993 | Kawasaki et al. | 327/156 |
| 5,977,837 A | * | 11/1999 | Byrn et al. | 331/1 A |
| 6,130,566 A | * | 10/2000 | Yokomizo | 327/175 |
| 6,218,869 B1 | * | 4/2001 | Hongbin Hao et al. | 327/24 |
| 6,341,146 B1 | * | 1/2002 | Johnson et al. | 375/329 |
| 6,356,129 B1 | * | 3/2002 | O'Brien et al. | 327/175 |
| 6,392,641 B1 | * | 5/2002 | Nishimura et al. | 345/213 |
| 6,404,458 B1 | * | 6/2002 | Kang | 348/445 |
| 6,665,359 B1 | * | 12/2003 | Flake | 375/354 |

FOREIGN PATENT DOCUMENTS

JP            61-22441          9/1988

* cited by examiner

*Primary Examiner*—Emmanuel Bayard
(74) *Attorney, Agent, or Firm*—Venable LLP; Michael A. Sartori; Catherine M. Voorhees

(57) ABSTRACT

A delay apparatus delays a rising edge and a falling edge of a digital signal. The delay apparatus includes a first edge detection circuit which detects a first edge or rising edge of the digital signal and generates a detection signal; a set circuit that includes a first counter for generating a count value and clearing the count value in response to the detection signal, wherein the set circuit generates a set signal if the count value reaches the number of the reference clock signals corresponding to the delay period of time; a reset circuit which generates a reset signal if an elapsed period of time since a generation of the set signal equals a period of time the digital signal maintains the second logic level; and an output circuit that outputs a delayed digital signal including edges synchronized with the set signal and the reset signal.

18 Claims, 10 Drawing Sheets

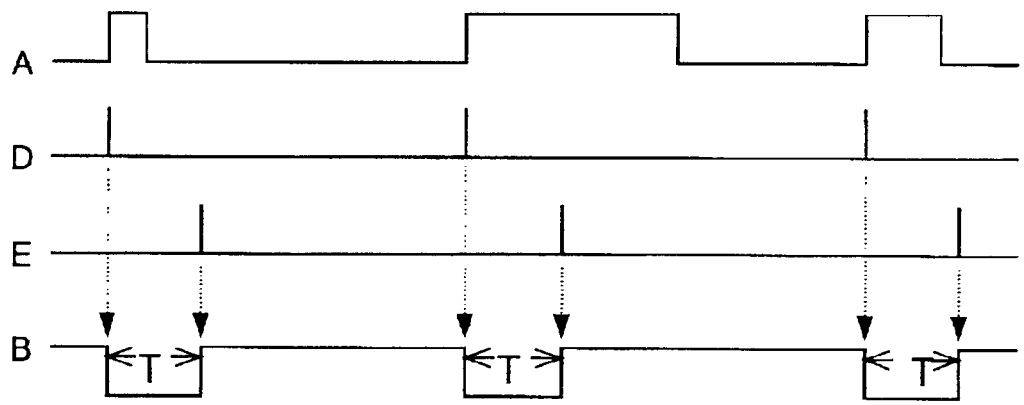
FIG. 10    (PRIOR ART)
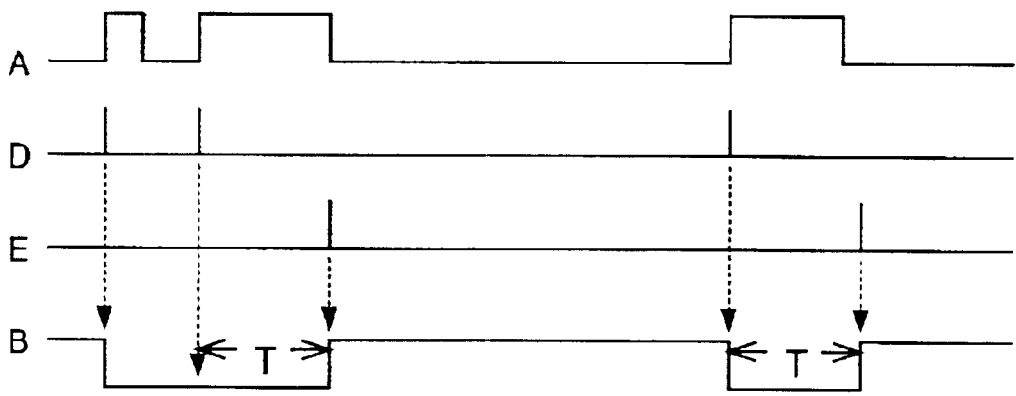
FIG. 11    (PRIOR ART)

DELAY APPARATUS AND METHOD

CROSS REFERENCE TO RELATED APPLICATION

This application claims the priority of Japanese application Serial No. 75834/2000 filed Mar. 17, 2000, the subject matter of which is incorporated herein by reference.

BACKGROUND OF THE INVENTION

1. Field of the Invention

This invention relates to a delay apparatus and method for delaying a digital signal for a predetermined delay period of time 2. Description of Related Art A conventional delay apparatus is disclosed in Japanese laid-open patent application 63-224411. FIG. 9 is a block diagram showing the conventional delay apparatus. The delay apparatus of FIG. 9 comprises a rising edge detection circuit 101, an RS flip-flop 102, a frequency demultiplier 103, a counter 104, a comparator 106, a read only memory (ROM) 107, and a decoder 108. In FIG. 9, the rising detection circuit 101 detects the rising edge of the digital signal A, and outputs an edge detection signal D. The RS flip-flop 102, a frequency demultiplier 103, and a counter 104 are reset by the edge detection signal D. After the counter 104 is reset by the edge detection signal D, the counter 104 increments its own count value. The comparator 106 outputs a detection signal E if a value stored by the ROM 107 equals to a count value of the counter 104. The RS flip-flop 102 is set by the detection signal E.

The operation of the conventional delay apparatus shown in FIG. 9 is described by using FIG. 10. FIG. 10 is a timing chart showing the operation of the conventional delay apparatus. In FIG. 10, time is plotted on the horizontal axis. As shown in FIG. 10, the rising edge of the digital signal A is delayed for a delay period of time T which is set at various values by the decoder 108 and the ROM 107.

As described above, the conventional delay apparatus can achieve a highly stable and accurate operation without fluctuation by time elapsing, because the conventional delay apparatus sets the delay period of time T by means of an accurate digital clock signal.

As shown in FIG. 10, in the conventional delay apparatus shown in FIG. 9, the rising edge of the digital signal A can be provided the delay period of time, which is a pulse signal B of the RS flip-flop 102. However, the falling edge of the digital signal A can not be provided the delay period of time T. Hence, the conventional delay apparatus can not output the pulse signal B the period of time while which maintains the level "1" is equal to the period of time while the digital signal A maintains the level "1". Hence the conventional delay apparatus can not operate in the system using not only the rising edge but also falling edge of the output pulse signal B.

SUMMARY OF THE INVENTION

An object of the present invention is to provide a delay apparatus which can delay not only a rising edge but also falling edge of the digital signal for a predetermined delay period of time.

To achieve the above-described object of the present invention, according to the present invention, there is provided a delay apparatus for delaying a digital signal for a predetermined delay period of time, the digital signal having first and second logic levels, comprising:

a first edge detection circuit which detects a first edge of the digital signal whereon the level of the digital signal changes from the first logic level to the second logic level, and generates a first detection signal;

a set circuit which includes a first counter for counting a reference clock signal to generate a count value and clearing its own count value in response to the first detection signal, wherein the set circuit generates a set signal if the count value reaches the number of the reference clock signals corresponding to the delay period of time;

a reset circuit which generates a reset signal if an elapsed period of time since a generation of the set signal equals a period of time while the digital signal maintains the second logic level; and an output circuit which outputs a digital signal including edges synchronized with the set signal and the reset signal.

BRIEF DESCRIPTION OF THE DRAWINGS

FIG. 10 is a timing chart showing the operation of the conventional delay apparatus.

FIG. 11 is a timing chart showing a problem of the operation of the conventional delay apparatus.

DESCRIPTION OF THE PREFERRED EMBODIMENTS

Preferred embodiments of the present invention will be described with reference to the drawings, but the present invention is not limited to the following embodiments.

(First Embodiment)

Figure 1:
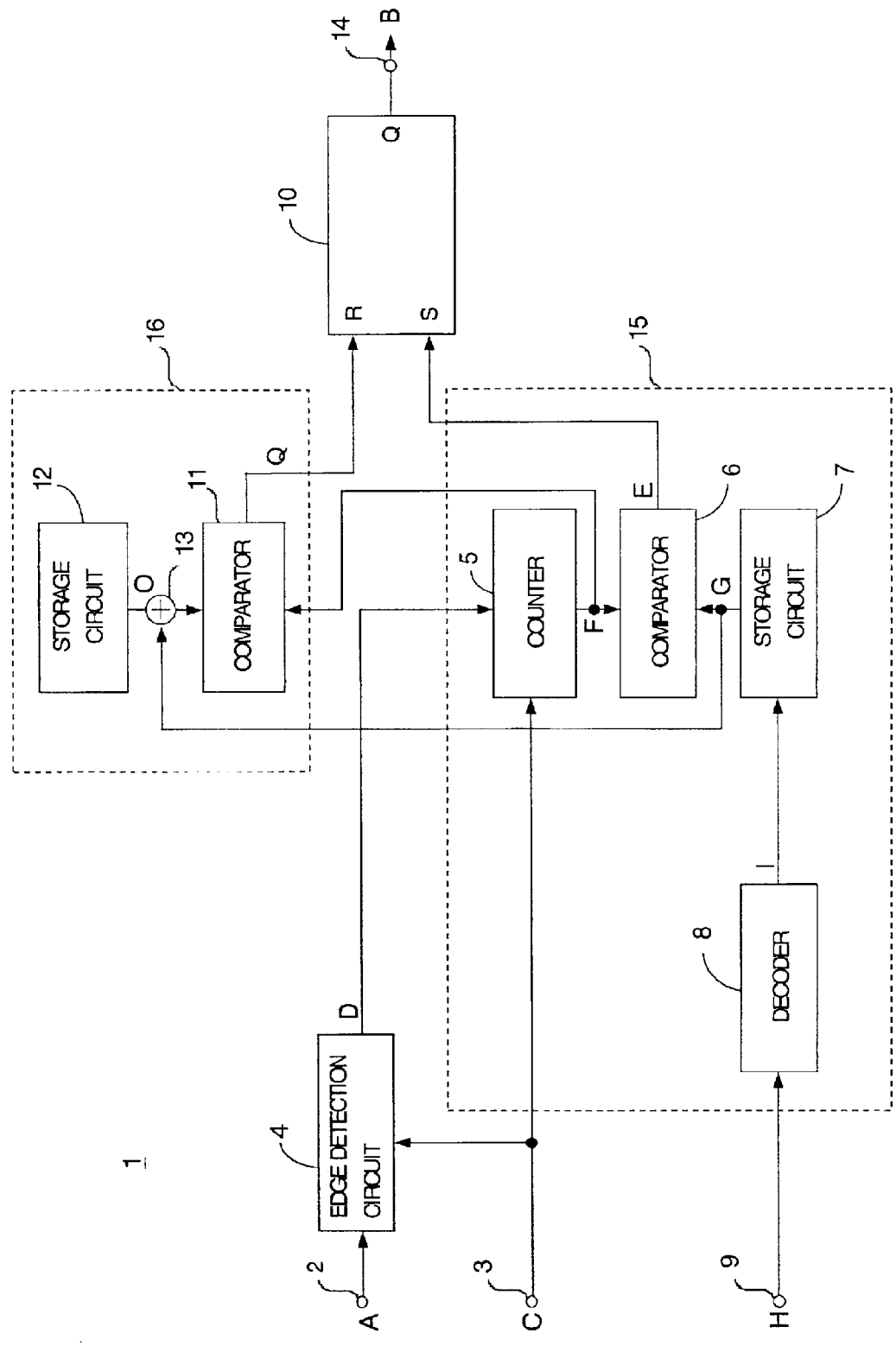
FIG. 1 is a block diagram showing a delay apparatus of a first embodiment of the present invention.

The first embodiment of the present invention will be explained by using FIG. 1. FIG. 1 is a block diagram showing a delay apparatus 1 of a first embodiment of the present invention.

In FIG. 1, the delay apparatus 1 of the first embodiment of the present invention comprises an input terminal 2 and 3, a rising edge detection circuit 4 as a first edge detection circuit of the present invention, a counter 5 as a first counter of the present invention, a comparator 6 as a first comparator of the present invention, a storage circuit 7, a decoder 8, an input terminal 9, an RS flip-flop 10 as a output circuit of the present invention, a comparator 11 as a second comparator of the present invention, a storage circuit 12, an adder 13, and an output terminal 14.

A digital signal A which has a first and a second logic levels is input to the input terminal 2. A clock pulse C, as a reference clock signal of the present invention, is input to the input terminal 3. In the first embodiment, the first logic level of the digital signal A is defined as "0", and the second logic level of it is defined as "1". It is possible to reverse the value of these logic levels. In the following description, the meaning of the expression "the change of the logic level of the digital signal A from "0" to "1"" is also referred to the expression "the rising of the digital signal A", and the meaning of the expression "the change of the logic level of the digital signal A from "1" to "0"" is also referred to the expression "the falling of the digital signal A".

The rising edge detection circuit 4 is connected to the input terminal 2 and 3. The rising edge detection circuit 4 detects the rising edge of the digital signal A input via the input terminal 2 whereon the logic level of the digital signal A changes from the first logic level "0" to the second logic level "1", and outputs an edge detection signal D. More specifically, the rising edge detection circuit 4 synchronizes the digital signal A with the clock pulse signal C, and outputs the rising edge of the synchronized digital signal A as the edge detection signal D. The edge detection signal D is connected to the counter 5. The input terminal 3 is also connected to the counter 5. In the first embodiment, the counter 5 uses an M-bit counter, wherein the number of M is a natural number. The counter 5 counts the clock pulse signal C to generate a count value and clears its own count value in response to the edge detection signal D. If the counter 5 clears its own count value, the counter 5 resets its own count value at "0". The count value F of the counter 5 is connected to the comparator 6.

An output signal G of the storage circuit 7 is also connected to the comparator 6. The storage circuit 7 stores various digital values at a plurality of addresses in advance. An output signal I of the decoder 8 is connected to the storage circuit 7. The input terminal 9 is connected to the decoder 8. The mode set signal H is input to the input terminal 9. The mode set signal H is used in order to set the delay period of time which is provided for the digital signal A. The decoder 8 decodes the mode set signal H, and interprets it into the number which corresponds to the number of the clock pulse signal C based on the mode set signal H, wherein the interpreted number corresponds to the delay period of time. And the decoder 8 outputs an address value I based on the interpreted number of the clock pulse signal C. The address value I output from decoder 8 is input to the storage circuit 7. The storage circuit 7 outputs output signal G, a value of which is stored at the address I from the decoder 8. The value of the output signal G is equal to the number of the clock pulse signals C corresponding to the delay period of time. The delay period of time is set by the storage circuit 7, the decoder 8 and the input terminal 9. A ROM, a RAM, and a resister can be applied to the storage circuit 7. If the RAM is applied to a storage circuit 7, the decoder 8 outputs the number of the clock pulse signals C corresponding to the delay period of time in addition to the address value I. If the register is applied to the storage circuit 7, the decoder 8 outputs an enable signal in addition to the address value I. As described above, various devices which set the number of clock signals C corresponding to the delay period of time can be applied to the delay apparatus 1.

The comparator 6 compares the value of the output signal F from the counter 5 with the value of the output signal G from the storage circuit 7. If the values of the output signal F and output signal G equal each other, the comparator 6 outputs a set signal E. The elements represented by reference numeral from 5 to 9 constitute a set circuit 15 of the first embodiment of the present invention. The set signal E is connected to a set terminal of the RS flip-flop 10.

The output signal F of the counter 5 is also connected to the comparator 11. An output signal of the adder 13 is connected to the comparator 11. The adder 13 adds the value of the output signal G from the storage circuit 7 to the value of the output signal 0 from the storage circuit 13, and generates a value of (0+G). The storage circuit 12 stores in advance the number of clock pulse signals C corresponding to the period of time while the digital signal A maintains the second logic level "1". In the first embodiment, the period of time while the digital signal A maintains the second logic level is constant value, and known beforehand. The resister and ROM can be applied to the storage circuit 12. The comparator 11 compares the output signal (0+G) from the adder 13 with the output signal F from the counter 5. If the values of the output signal (0+G) and the output signal F equal each other, the comparator 11 generates a reset signal Q. The comparator 11, the storage circuit 12 and the adder 13 constitute a reset circuit 16 of the first embodiment of the present invention. The reset signal Q is connected to a reset terminal of the RS flip-flop 10. The RS flip-flop 10 outputs a digital signal B which includes a rising edge synchronized with the set signal E and the falling edge synchronized with the reset signal Q.

Figure 2:
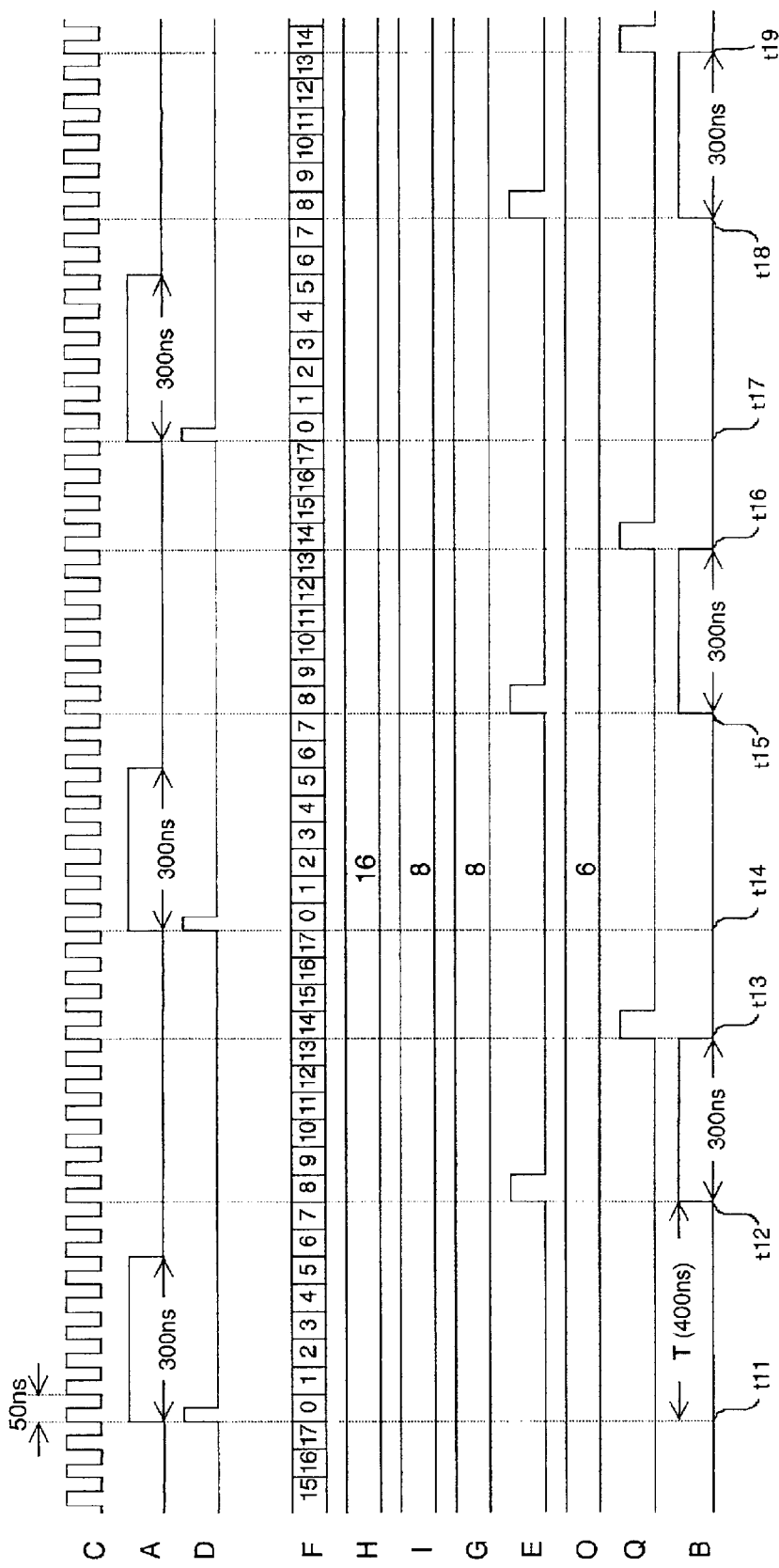
FIG. 2 is a timing chart showing the operation of the delay apparatus of the first embodiment of the present invention.

The operation of the delay apparatus of the first embodiment will next be described with reference to the drawing FIG. 2. FIG. 2 is a timing chart showing the operation of the delay apparatus of the first embodiment of the present invention. In FIG. 2, the representation of each delay of signal caused by each element is omitted in order to explain the operation of delay apparatus 1 concisely.

In the first embodiment, a cycle time of the clock pulse signal C is 50 nanosecond (ns.), the predetermined delay period of time is 400 ns. The period of time while the digital signal A maintains a second logic level is constant, which is 300 ns. On the above-described condition, in the delay apparatus 1, the setting of the number of the clock pulse signals C corresponding to the delay period of time T is performed as following description. The number of the clock pulse signals C corresponding to the delay period of time T(400 ns.) is equal to "8".

As shown in FIG. 2, the mode set signal H (H="16") is input to the decoder 8 via the input terminal 9. The decoder 8 outputs the address value I (I="8") based on the interpreted number of the clock pulse signal C. The storage circuit 7 outputs the output signal G the value of which is equal to "8", stored at an address of "8". As described above, the setting of the number of the clock pulse signals C corresponding to the delay period of time T is performed. The storage circuit 12 stores the number of clock pulse signals C corresponding to the delay period of time T as "6" in advance. The values of the mode set signal H and the address value I are just one example. Various values can be applied to the system the delay apparatus of the present invention is used.

As shown in FIG. 1, the digital signal A is input to the rising edge detection circuit 4 via the input terminal 2, and is synchronized with the clock pulse signal C.

At time t11 shown in FIG. 2, if the logic level of the digital signal A changes from "0" to "1", the rising edge detection circuit 4 outputs the rising edge of the synchronized digital signal A as the edge detection signal D. The counter 5 resets its own count value at "0" in response to the edge detection signal D. After the time t11, the counter 5 counts the clock pulse signal C.

Next, at a time t12, the comparator 6 outputs the set signal E, since the value of the output signal F reaches the value of the output signal G. The RS flip-flop 10 changes the value of the digital signal B from "0" to "1" synchronously with the set signal E. This time t12 when the digital signal B rises is delayed for a period of time corresponding to the eight clock pulse signals C from the time t11 when the digital signal A rises. Therefor, the time t12 is delayed for the predetermined delay period of time which is equal to 400 ns from the time t11. The comparator 11 compares the value of the output signal (0+G) from the adder 13 with the value of the output signal F from the counter 5. In the first embodiment, the value of the (0+G) is equal to "14".

At a time t13, the comparator 11 outputs the reset signal Q, since the value of the output signal F reaches the value of the output signal (0+G) which is equal to "14". The RS flip-flop 10 changes the value of the digital signal B from "1" to "0" synchronously with the set signal E. This time t13 when the digital signal B falls is delayed for a period of time corresponding to the six clock pulse signals C from the time t12 when the digital signal B rises. Therefor, a period of time while the digital signal B maintains the second logic level "1" equals to the period of time while the digital signal A maintains the second logic level "1".

At a time t14, if the logic level of the digital signal A changes from "0" to "1" once more, the rising edge detection circuit 4 outputs the edge detection signal D. The counter 5 resets its own count value at "0" in response to the edge detection signal D. After the time t14, the counter 5 counts the clock pulse signal C.

After the time t14, the delay apparatus 1 repeats the operation described above. In other words, the rising edge of the digital signal A at the time t14 is delayed for the delay period of time T which is equal to 400 ns., so that the digital signal B rises at a time t15. At a time t16, because an elapsed period of time since the time t15 equals to the period of time while the digital signal A maintains the second logic level "1", the digital signal B falls. After the time t16, the operation described above is repeated between a time t17 and t19.

As described above, in the first embodiment, if the digital signal A has a constant period of time while a second logic level is maintained, the delay apparatus 1 can delay not only the rising edge but also the falling edge of the digital signal A for the delay period of time. Hence, it is possible to apply the delay apparatus 1 to the system using not only the rising edge but also the falling edge of the digital signal B.

(Second Embodiment)

Figure 3:
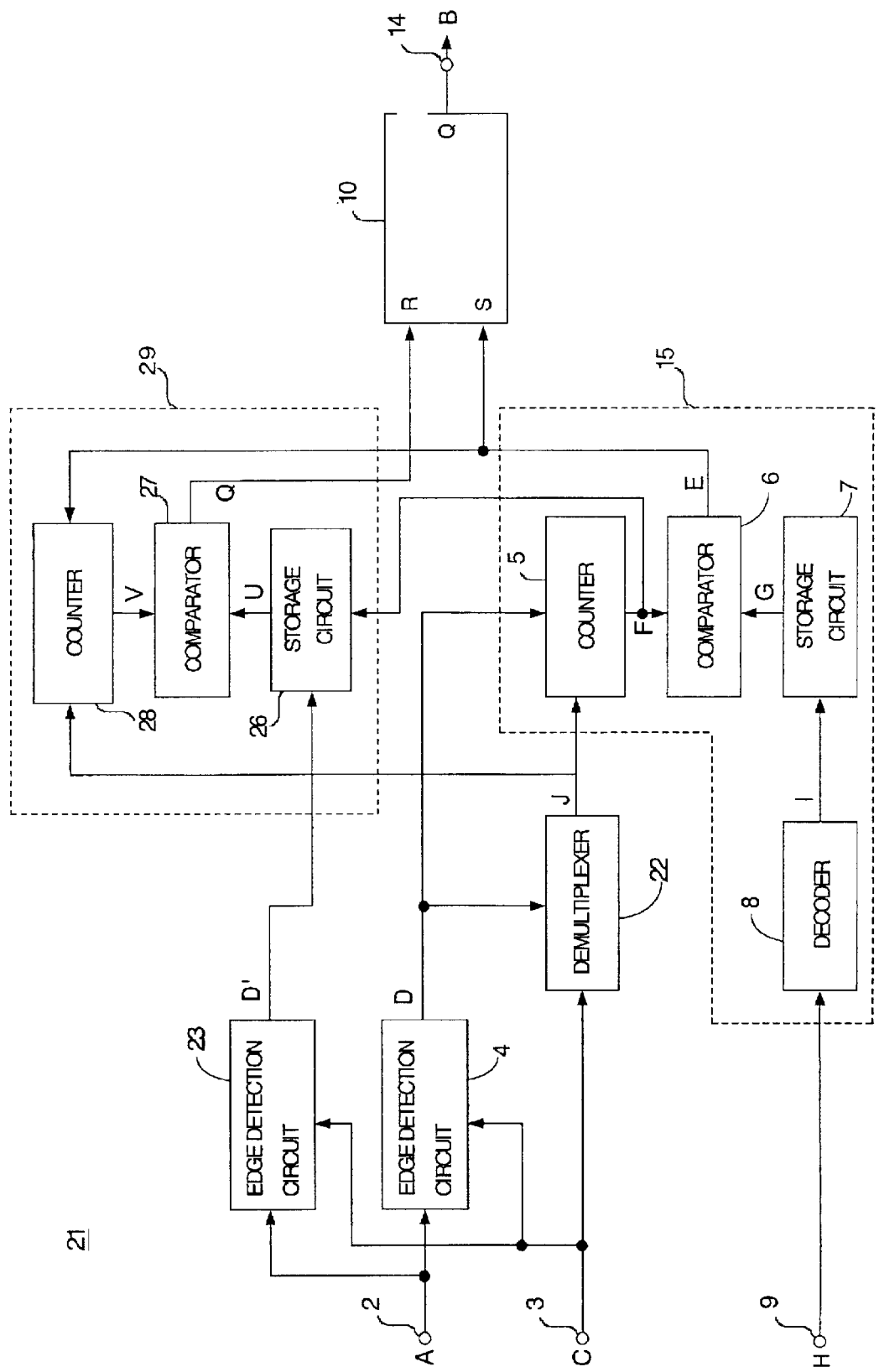
FIG. 3 is a block diagram showing a delay apparatus of a second embodiment of the present invention.

The second embodiment of the present invention will be explained by using FIG. 3. FIG. 3 is a block diagram showing a delay apparatus of a second embodiment of the present invention.

In the description of the second embodiment, the constituting elements corresponding to the constituting elements of the first embodiment are denoted with the same reference numerals, and the detailed description thereof is omitted. The second embodiment is different from the first embodiment in the following respects, but constituted in the same manner as the first embodiment in the other respects.

In the second embodiment, the digital signal A has a variable period of time while the digital signal maintains the second logic level.

In FIG. 3, in a delay apparatus 21 of the second embodiment, a frequency demultiplier 22 is disposed between the input terminal 3 and the counter 5. The edge detection signal D of the rising edge detection circuit 4 and the clock pulse signal C are connected to the frequency demultiplier 22. The frequency demultiplier 22 is reset by the rising edge detection signal D, and demultiplexes a frequency of the input clock pulse signal C. The demultiplexed clock pulse signal C, an output signal J, is input to the counter 5.

The delay apparatus 21 comprises a falling edge detection circuit 23 as a second edge detection circuit of the present invention in addition to the rising edge detection circuit 4. The digital signal A and the clock pulse signal C are input to the falling edge detection circuit 23 via the input terminal 2 and 3 in the same manner as the rising edge detection circuit 4. The falling edge detection circuit 23 detects the falling edge of the digital signal A whereon the logic level of the digital signal A changes from the second logic level "1" to the first logic level "0", and outputs an edge detection signal D' as a second detection signal of the present invention.

The edge detection signal D' is connected to a storage circuit 26. The output signal F of the counter 5 is connected to the storage circuit 26. The storage circuit 26 stores the value of the output signal F of the counter 5 in response to the edge detection signal D'. The stored value of the output signal F in the storage circuit 26 is output as an output signal U. A flip-flop can be applied to the storage circuit 26. If the flip-flop is applied to the storage circuit 26, the edge detection signal D' is input to an input terminal of the flip-flop. The output signal U of the storage circuit 26 is connected to a comparator 27 as a second comparator of the present invention. An output signal V of a counter 28 as a second counter of the present invention is connected to the comparator 27. An output signal J of the frequency demultiplier 22 and the set signal E of the comparator 6 are connected to the counter 28. In the second embodiment, the counter 28 uses an M bit up counter, wherein the number of M is a natural number. The counter 28 counts the output signal J of the frequency demultiplier 22 to generate a count value and clears its own count value in response to the set signal E of the comparator 6. If the counter 28 clears its own count value, the counter 28 resets its own count value at "0". The comparator 27 compares the value of the output signal U with the value of the output signal V. If the values of the output signal U and the value of the output signal F equal each other, the comparator 27 outputs a reset signal Q. The reset signal Q is connected to the reset terminal of the RS flip-flop 10. The elements represented by reference numeral from 26 to 28 constitute a reset circuit 29 of the second embodiment of the present invention.

Figure 4:
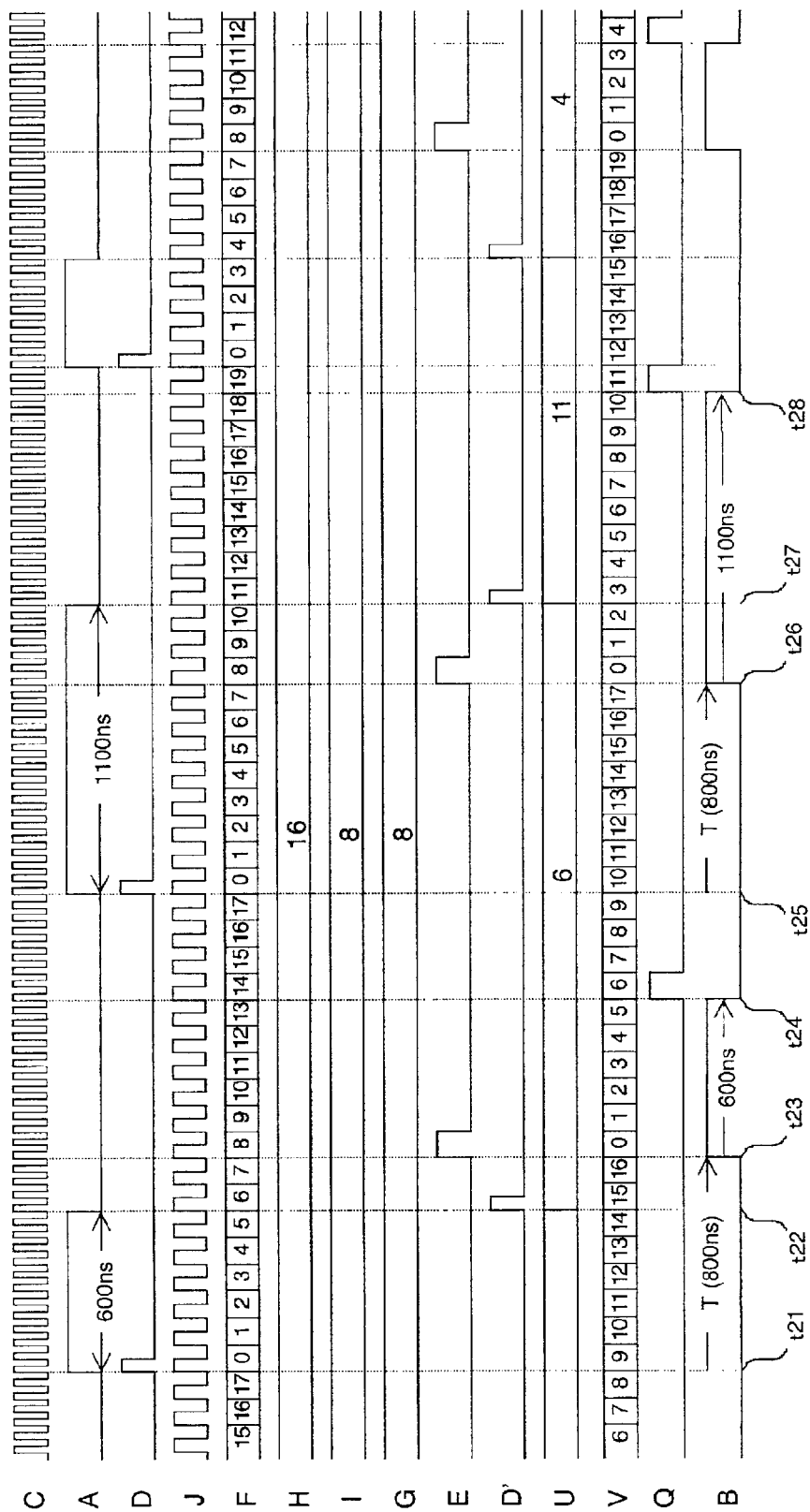
FIG. 4 is a timing chart showing the operation of the delay apparatus of the second embodiment of the present invention.

The operation of the delay apparatus 21 will next be described with reference to the drawing FIG. 4. FIG. 4 is a timing chart showing the operation of the delay apparatus 21. In FIG. 4, the representation of each delay of signal caused by each element is omitted in order to explain the operation of delay apparatus 21 concisely.

In the second embodiment, the cycle time of the clock pulse signal C is set at 50 ns., and the predetermined delay period of time provided for the digital signal A is set at 800 ns. In this case, the number of the output signals J of the frequency demultiplier 22 corresponding to the predetermined delay period of time T is equal to "8".

At time t21 shown in FIG. 4, if the logic level of the digital signal A changes from "0" to "1", the rising edge detection circuit 4 outputs the edge detection signal D. The frequency demultiplier 22 is reset in response to the rising edge detection signal D, and demultiplexes hereafter the frequency of the input clock pulse signal C. In the second embodiment, the frequency demultiplier 22 demultiplexes the frequency of the clock pulse signal C by 2. The frequency demultiplier 22 demultiplexes the cycle time which of the input clock pulse signal C, which is equal to 50 ns, by 2, and outputs demultiplexed output signal J of which cycle time is 100 ns. The counter 5 resets its own count value at "0" in response to the edge detection signal D, and hereafter counts the clock pulse signal C.

At a time t22, if the logic level of the digital signal A changes from "1" to "0", the falling edge detection circuit 24 outputs the edge detection signal D'. The storage circuit 26 stores the value of the output signal F in response to the edge detection signal D' at the time t22, and outputs it as the output signal U. In this time, the value of the output signal U of the storage circuit 26 is "6". This value "6" is equal to the number of the output signals J corresponding to the period of time while the digital signal A maintains the second logic level "1".

At a time t23, the comparator 6 outputs the set signal E, since the value of the output signal F reaches the value "8" of the output signal G. The counter 28 resets its own count value at "0" in response to the set signal E, and hereafter counts the output signal J of the frequency demultiplier 22. The RS flip-flop 10 changes the value of the digital signal B from "0" to "1" synchronously with the set signal E. This time t23 when the digital signal B rises is delayed for a period of time corresponding to the eight clock pulse signals C from the time t21 when the digital signal A rises. Therefor, the time t23 is delayed for the delay period of time which is equal to 800 ns. from the time t21.

At a time t24, the comparator 27 outputs the reset signal Q, since the value of the output signal U from the storage circuit 26 reaches the value of the output signal V from the counter 28. The RS flip-flop 10 changes the value of the digital signal B from "1" to "0" synchronously with the reset signal Q. An elapsed period of time since the time t23 equals to the period of time while the digital signal A maintains the second logic level "1" which is 600 ns. Therefor, a period of time while the digital signal B maintains the second logic level "1" equals to the period of time while the digital signal A maintains the second logic level "1".

At a time t25, if the logic level of the digital signal A changes from "0" to "1" once more, the rising edge detection circuit 4 outputs the edge detection signal D. At the time t25, the delay apparatus 21 repeats the same operation at the time t21.

At a time t26, the operation at the time 23 is repeated once more, that is, the RS flip-flop 10 changes the value of the digital signal B from "0" to "1" synchronously with the set signal E. This time t26 is delayed for a period of time corresponding to the eight clock pulse signals C from the time t25, which is equal to 800 ns.

At a time t27, if the logic level of the digital signal A changes from "1" to "0", the same operation at the time t22 is repeated. In other words, the falling edge detection circuit 24 outputs the edge detection signal D'. The storage circuit 26 stores the value of the output signal F in response to the edge detection signal D' at the time t22, and outputs it as the output signal U. The value of the output signal U from the storage circuit 26 is equal to "11". This value "11" is equal to the number of the output signals J output between the time t25 and t27. In other words, this value "11" corresponds to the number of the output signals J corresponding to the period of time while the digital signal A maintains the second logic level "1", which is equal to 1100 ns.

At a time t28, in the same manner as the above-described operation at the time t24, the comparator 27 outputs the reset signal Q. The RS flip-flop 10 changes the value of the digital signal B from "1" to "0" synchronously with the reset signal Q. An elapsed period of time since the time t26 equals to the period of time, 1100 ns., while the digital signal A maintains the second logic level "1". Therefor, a period of time while the digital signal B maintains the second logic level "1" equals to the period of time while the digital signal A maintains the second logic level "1".

As described above, in the second embodiment, in addition to the first embodiment, the delay apparatus 21 can delay the digital signal A which has a variable period of time while the second logic level is maintained for the predetermined delay period of time. And the delay apparatus 21 can output the digital signal B the period of time while which maintains the second level is equal to the period of time while the digital signal A maintains the second level.

(Third Embodiment)

Figure 5:
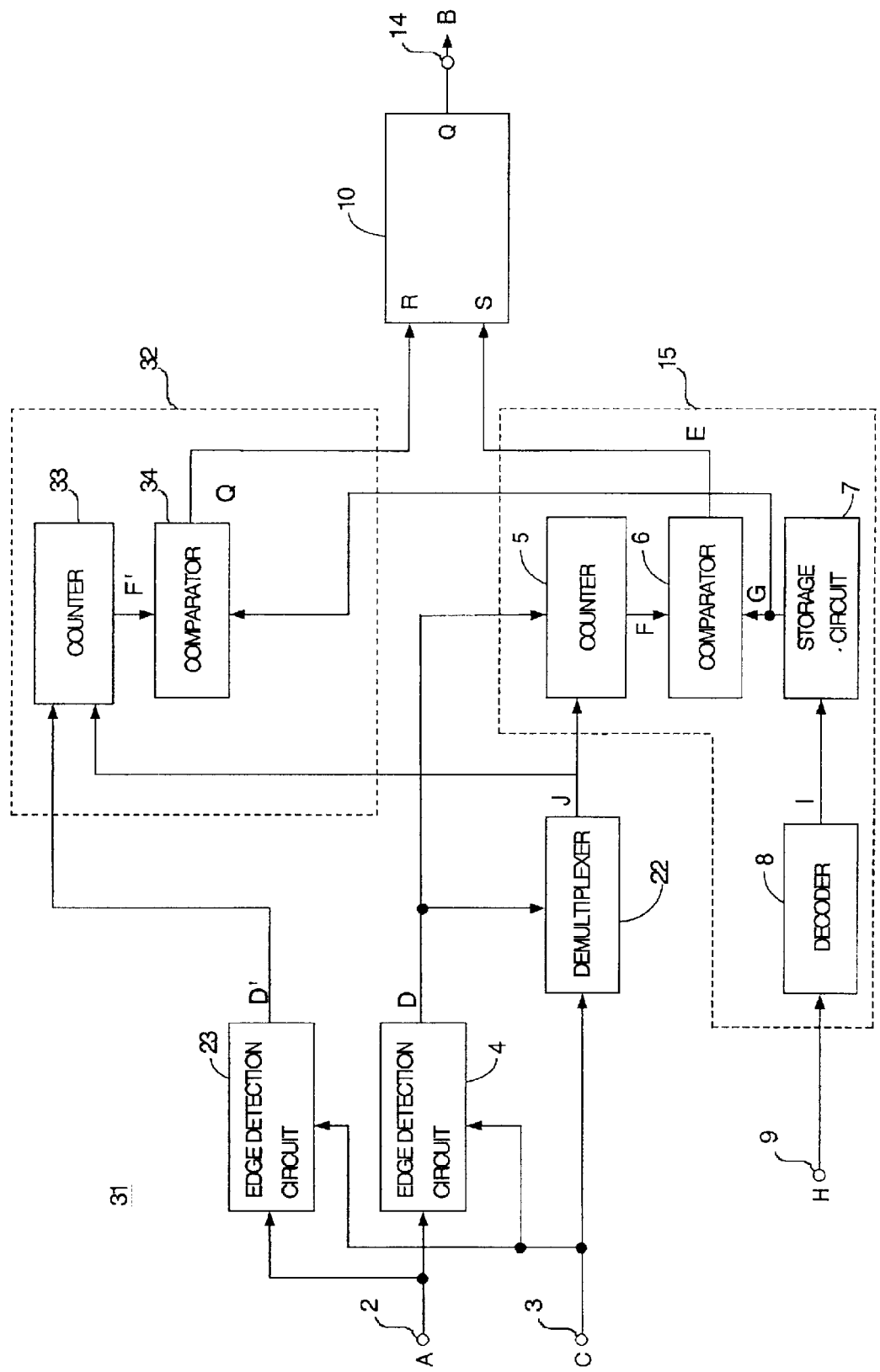
FIG. 5 is a block diagram showing a delay apparatus of a third embodiment of the present invention.

The third embodiment of the present invention will be explained by using FIG. 5. FIG. 5 is a block diagram showing a delay apparatus of a third embodiment of the present invention.

In the description of the third embodiment, the constituting elements corresponding to the constituting elements of the second embodiment are denoted with the same reference numerals, and the detailed description thereof is omitted. The third embodiment is different from the second embodiment in the following respects, but constituted in the same manner as the second embodiment in the other respects.

In FIG. 5, in a delay apparatus 31 of the third embodiment, a reset circuit 32 is disposed instead of the reset circuit 29 shown in FIG. 3. The reset circuit 32 comprises a counter 33 as a third counter of the present invention, and a comparator 34 as a third comparator of the present invention. The edge detection signal D' and the output signal J of the frequency demultiplier 22 are connected to the counter 33. In the third embodiment, the counter 33 uses an M-bit up counter, wherein the number of M is a natural number. The counter 33 counts the output signal J of the frequency demultiplier 22 to generate a count value F', and clears its own count value in response to the edge detection signal D'. If the counter 33 clears its own count value, the counter 33 resets its own count value at "0". The comparator 34 compares the value of the output signal F' from the counter 33 with the value of the output signal G from the storage circuit 7. If the value of the output signal F' and the value of the output signal G equal each other, the comparator 34 outputs a reset signal Q. The reset signal Q is connected to the reset terminal of the RS flip-flop 10.

Figure 6:
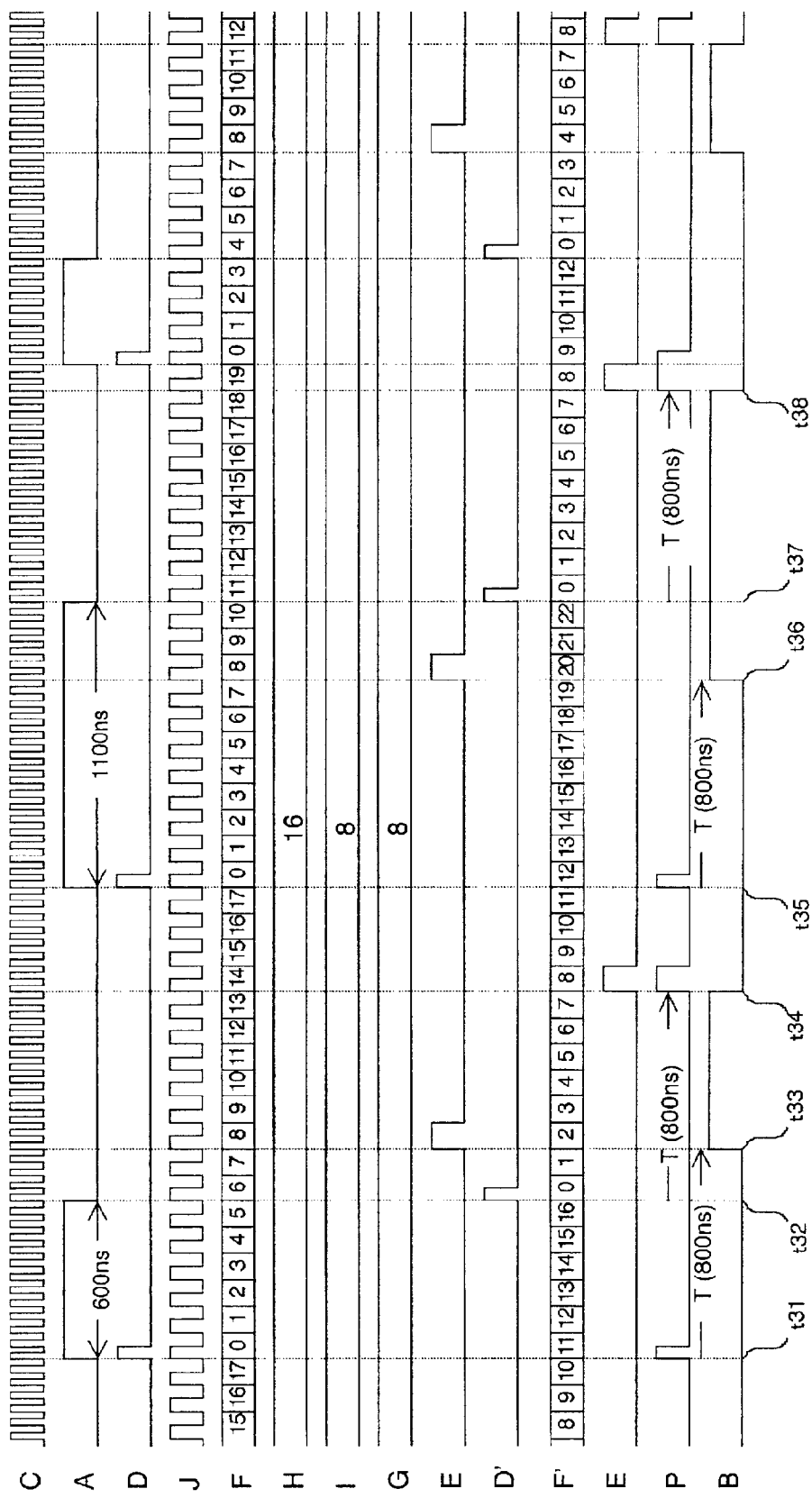
FIG. 6 is a timing chart showing the operation of the delay apparatus of the third embodiment of the present invention.

The operation of the delay apparatus 31 will next be described with reference to the drawing FIG. 6. FIG. 6 is a timing chart showing the operation of the delay apparatus 31. In FIG. 6, the representation of each delay of signal caused by each element is omitted in order to explain the operation of delay apparatus 31 concisely.

In the third embodiment, in the same manner as the second embodiment, the cycle time of the clock pulse signal C is set at 50 ns., and the predetermined delay period of time provided for the digital signal A is set at 800 ns.

At time t31 shown in FIG. 6, if the logic level of the digital signal A changes from "0" to "1", the rising edge detection circuit 4 outputs the edge detection signal D. The frequency demultiplier 22 is reset in response to the rising edge detection signal D, and demultiplexes hereafter the frequency of the input clock pulse signal C. In the third embodiment, in the same manner as the second embodiment, the frequency demultiplier 22 demultiplexes the frequency of the input clock pulse signal C by 2. The counter 5 resets its own count value at "0" in response to the edge detection signal D, and hereafter counts the clock pulse signal C.

At a time t32, if the logic level of the digital signal A changes from "1" to "0", the falling edge detection circuit 23 outputs the edge detection signal D'. The counter 33 resets its own count value at "0" in response to the edge detection signal D', and hereafter counts the output signal J of the frequency demultiplier 22.

At a time t33, the comparator 6 outputs the set signal E, since the value of the output signal F reaches the value "8" of the output signal G. The RS flip-flop 10 changes the value of the digital signal B from "0" to "1" synchronously with the set signal E. This time t33 when the digital signal B rises is delayed for a period of time corresponding to the eight clock pulse signals C from the time t31 when the digital signal A rises. Therefor, the time t33 is delayed for the predetermined delay period of time, 800 ns., from the time t31.

At a time t34, the comparator 34 outputs the reset signal Q, since the value of the output signal F' from counter 33 reaches the value of the output signal G from the storage circuit 7. The value of the output signal F' is equal to the number of the output signals J corresponding to the period of time while the digital signal A maintains the second logic level "1". The RS flip-flop 10 changes the value of the digital signal B from "1" to "0" synchronously with the reset signal Q. This time t34 when the digital signal B falls is delayed for a period of time corresponding to the eight output signals J from the time t32 when the digital signal A falls. Therefor, the time t34 is delayed for the predetermined delay period of time from the time t32, which is equal to 800 ns.

At a time t35, if the logic level of the digital signal A changes from "0" to "1" once more, the rising edge detection circuit 4 outputs the edge detection signal D. At the time t35, the delay apparatus 31 repeats the same operation at the time t31.

At a time t36, in the same manner as the operation at the time t33, the comparator 6 outputs the set signal E. The RS flip-flop 10 changes the value of the digital signal B from "0" to "1" synchronously with the set signal E. This time t36 when the digital signal B rises is delayed for a period of time corresponding to the eight output signals J from the time t35 when the digital signal A rises. Therefor, the time t36 is delayed for the predetermined delay period of time from the time t35, which is equal to 800 ns.

At a time t37, if the logic level of the digital signal A changes from "1" to "0", in the same manner as above-described operation at the time t32, the falling edge detection circuit 23 outputs the edge detection signal D'. The counter 33 resets its own count value F' at "0" in response to the edge detection signal D', and hereafter counts the output signal J of the frequency demultiplier 22.

At a time t38, in the same manner as above-described operation at the time t34, the comparator 34 outputs the reset signal Q. The RS flip-flop 10 changes the value of the digital signal B from "1" to "0" synchronously with the reset signal Q. This time t38 when the digital signal B falls is delayed for a period of time corresponding to the eight output signals J from the time t37 when the digital signal A falls. Therefor, the time t38 is delayed for the predetermined delay period of time from the time t37, which is equal to 800 ns.

As described above, in the third embodiment, the delay apparatus 31 can delay the digital signal A which has a variable period of time while the second logic level is maintained for the predetermined delay period of time. And the delay apparatus 31 can output the digital signal B the period of time while which maintains the second level is equal to the period of time while the digital signal A maintains the second level. Furthermore, the storage circuit 26 of the second embodiment is omitted, so that the production cost of the delay apparatus 31 can be reduced.

(Fourth Embodiment)

Figure 7:
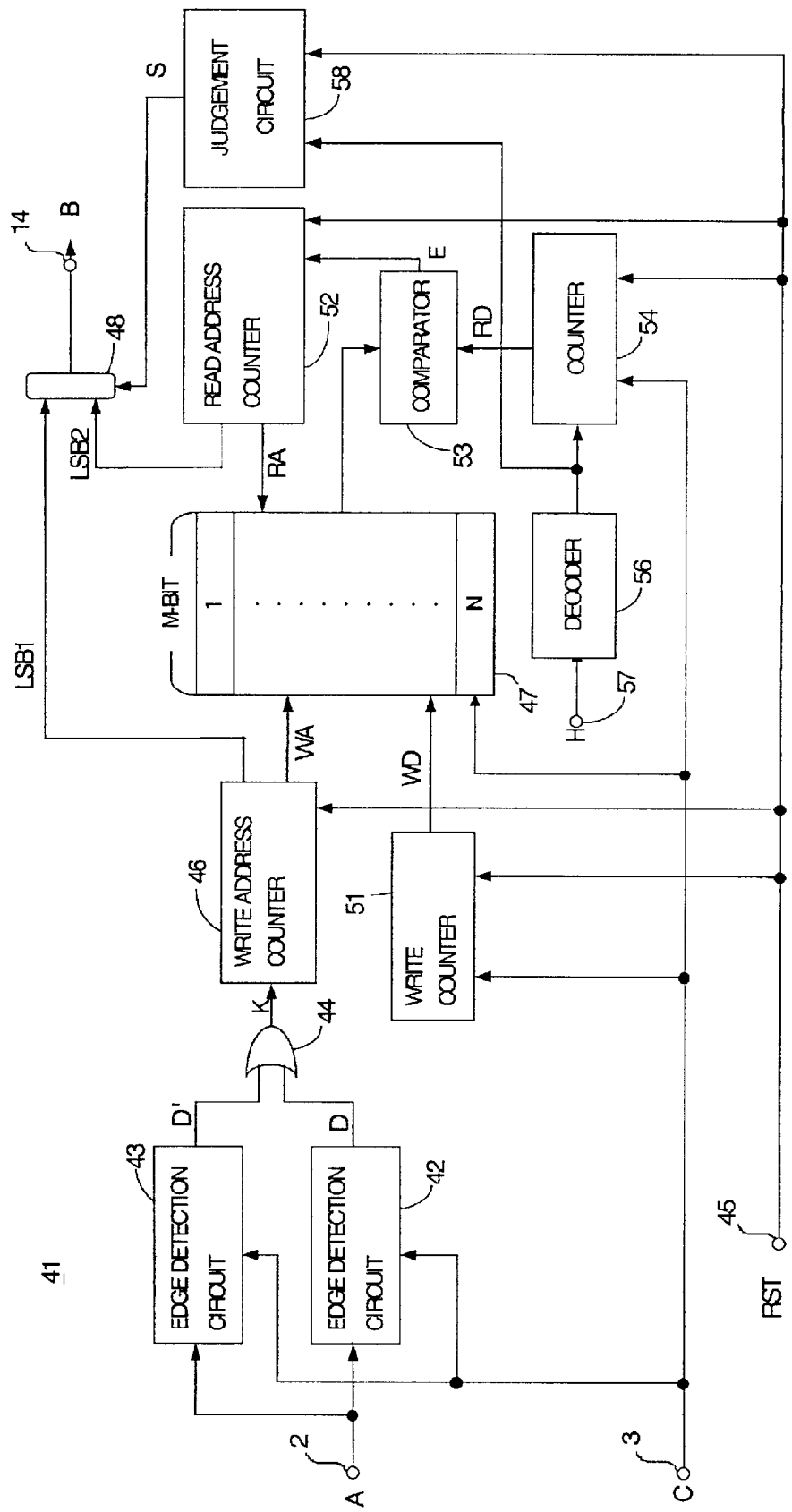
FIG. 7 is a block diagram showing a delay apparatus of a fourth embodiment of the present invention.

The fourth embodiment of the present invention will be explained by using FIG. 7. FIG. 7 is a block diagram showing a delay apparatus of a fourth embodiment of the present invention.

In the description of the fourth embodiment, the constituting elements corresponding to the constituting elements of the first embodiment are denoted with the same reference numerals, and the detailed description thereof is omitted. The fourth embodiment is different from the first embodiment in the following respects, but constituted in the same manner as the first embodiment in the other respects.

In FIG. 7, the delay apparatus 41 of the fourth embodiment of the present invention comprises a rising edge detection circuit 43 and a falling edge detection circuit 42. Each edge detection circuit 42 and 43 is constituted in the same manner as the edge detection circuit 4 and 23 described above. Each edge detevtion signal D and D' is connected to an OR circuit 44. An output signal K of the OR circuit 44 is connected to an write address counter 46. The write address counter 46 increments a write address WA in response to the output signal K of the OR circuit. The write address counter 46 resets the write address WA at "0" in response to a system reset signal RST input from outside via a reset terminal 45. If the write address WA reaches the countable maximum address, the write address counter 46 begins to increment the write address WA from "0" once more. In the fourth embodiment, the countable maximum address is set at "3". The write address WA output from the write address counter 46 is connected to a storage circuit 47. The write address counter 46 also outputs the least signifipant bit (LSB) of the write address WA to a selector 48 described later. The LSB of the write address WA is showed by symbol LSB1 in FIG. 7.

The delay apparatus 41 comprises a write counter 51. The clock pulse signal C and the system reset signal RST are input to the write counter 51. The write counter 51 decrements a write count value WD in response to the clock pulse signal C. The write counter 51 resets the write count value WD at a first initial value in response to a system reset signal RST. In the fourth embodiment, the first initial value is set at "0". The write count value WD output from the write counter 51 is connected to the storage circuit 47. In the fourth embodiment, the counter 33 uses an M-bit counter, wherein the number of M is a natural number.

For example, in the fourth embodiment, the storage circuit 47 is a RAM, organized as N words of M bits, wherein the number of M and N are a natural number. The storage circuit 47 can be a resister. The storage circuit 47 stores the write count value WD of the write counter 51 in accordance with the write address value WA synchronously with the clock pulse signal C. In the fourth embodiment, the number of N is set at "4" for the storage circuit 47, which is equal to the total number of the writing address WA.

The delay apparatus 41 comprises a read address counter 52. The system reset signal RST and an output signal E of a comparator 53 described later are connected to the read address counter 52. The read address counter 52 increments a read address RA in response to the output signal E of the comparator 53. The read address counter 52 resets the read address RA at "0" in response to the system reset signal RST. If the read address RA reaches a countable maximum address, the read address counter 52 begins to increment the read address RA from "0" once more. In the fourth embodiment, the countable maximum address is set at "3". The read address RA output from the read address counter 52 is connected to the storage circuit 47. The read address counter 52 also outputs the least significant bit (LSB) of the read address RA to the selector 48. The LSB of the read address RA is showed by symbol LSB2 in FIG. 7.

The storage circuit 47 outputs to the comparator 53 the write count value WD stored at an address in accordance with the read address RA. The comparator 53 compares the write count value WD read out from the storage circuit 47 with a read count value RD of a read counter 54. If the values of the write count value WD read out from the storage circuit 47 and the read count value RD equal each other, the comparator 53 outputs the output signal E. The output signal E is connected to the read address counter 52.

An output signal of a decoder 56, the clock pulse signal C and the system reset signal RST are connected to the read counter 54. An input terminal 57 is connected to the decoder 56. The mode set signal H described above is input to the input terminal 57. The decoder 56 decodes the mode set signal H, and interprets it into the number which corresponds to the number of the clock pulse signal C based on the mode set signal H, wherein the interpreted number corresponds to the delay period of time. The decoder 56 outputs the number of the clock pulse signals C corresponding to the delay period of time T. The read counter 54 decrements the read count value RD in response to the clock pulse signal C. The read counter 54 resets the read count value RD at a second initial value in response to the system reset signal RST. The second initial value has a difference of a value added one to the number of the reference clock signals corresponding to the delay period of time between the first initial value. In the fourth embodiment, the second initial value is set at a value added one to the value of the output signal of the decoder 56.

The output signal of the decoder 56 is also connected to a judgment circuit 58. The system reset signal RST is connected to the judgement circuit 58. The judgement circuit 58 judges whether the delay period of time is set or not based on the output signal of the decoder 56. In other words, when the system reset signal RST is input, the judgement circuit 58 stores the value of the output signal from the decoder 56. The judgement circuit 58 sets a value of an output signal S at "0" in case the stored value of the output signal from the decoder 56 is "0", that is, the delay period of time is not set. The judgement circuit 58 sets a value of an output signal S at "1" in case the stored value of the output signal from the decoder 56 is not "0", that is, the delay period of time is set. The output signal S is input to the selector 48. The selector 48 selects either the least significant bit (LSB) of the write address WA from the write address counter 46 or the least significant bit (LSB) of the read address RA from the read address counter 52 in accordance with the output signal S. In other words, the selector 48 selects the least significant bit (LSB) of the write address WA if the value of the output signal S is equal to "0", and the selector 48 selects the least significant bit (LSB) of the read address RA if the value of the output signal S is equal to "1". The selector 48 works as a role of the output circuit of the present invention.

Figure 8:
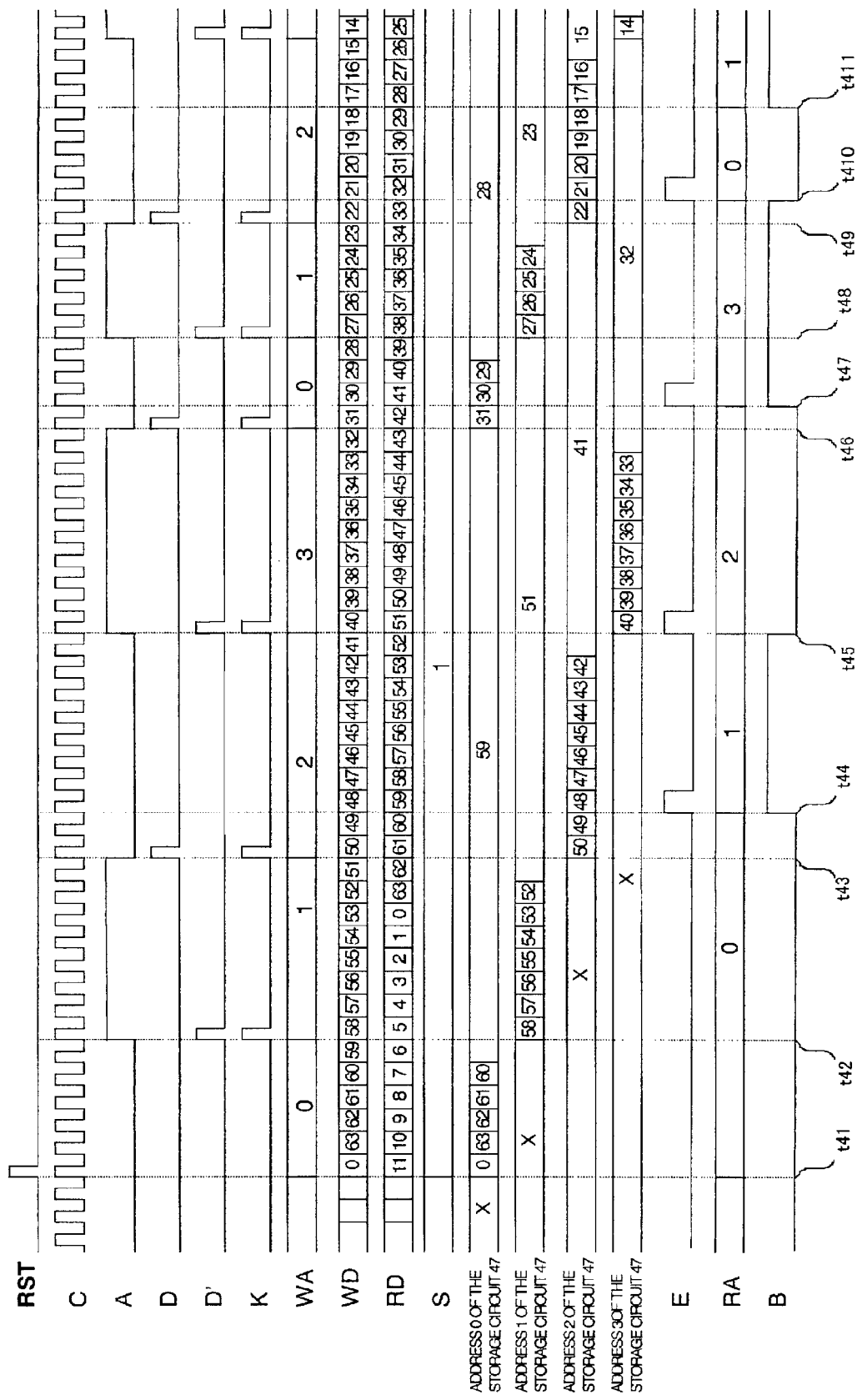
FIG. 8 is a timing chart showing the operation of the delay apparatus of the fourth embodiment of the present invention.
Figure 9:
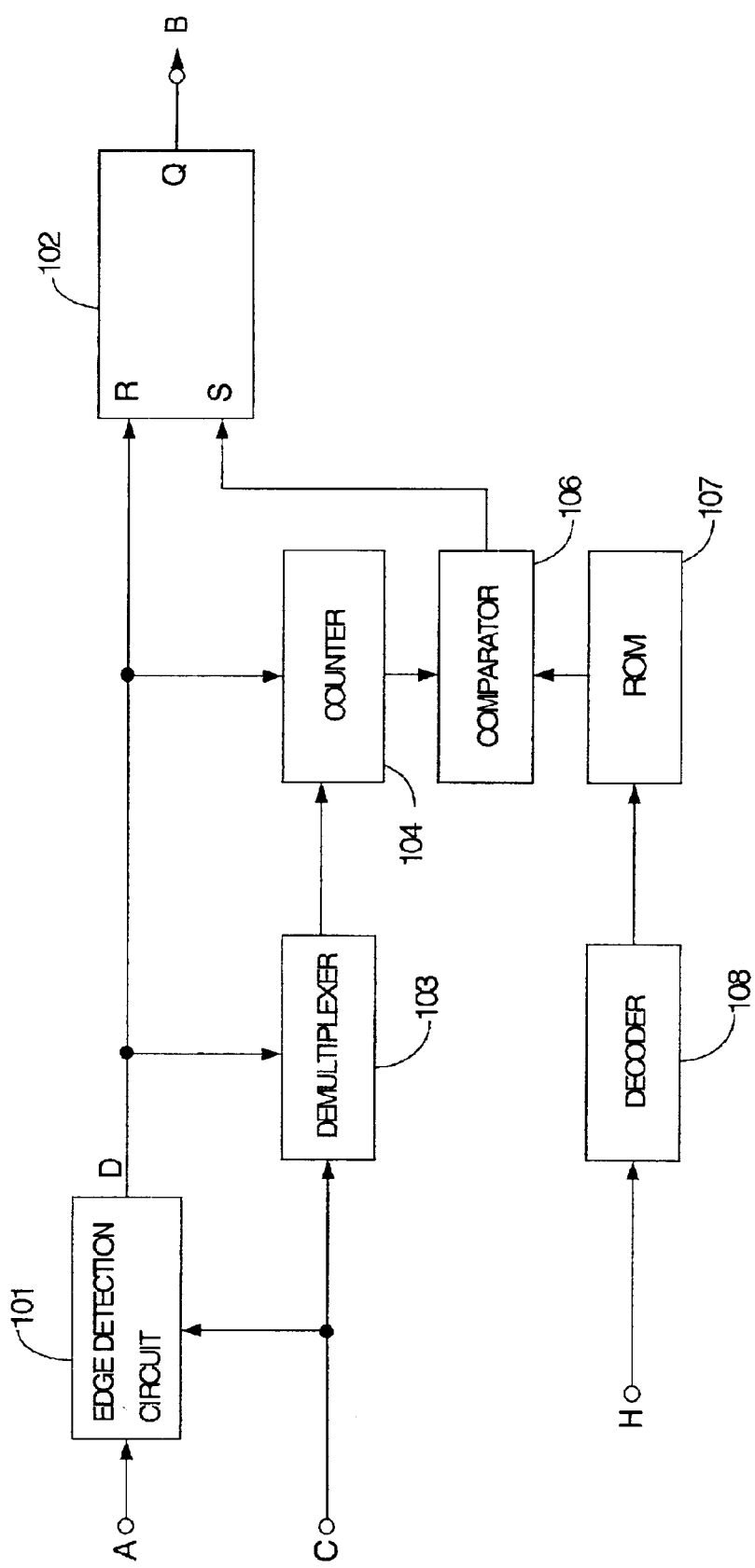
FIG. 9 is a block diagram showing a conventional delay apparatus.

The operation of the delay apparatus 41 of the fourth embodiment will next be described with reference to the drawing FIGS. 7 and 8. FIG. 8 is a timing chart showing the operation of the delay apparatus of the fourth embodiment of the present invention. In FIG. 8, the representation of each delay of signal caused by each element is omitted in order to explain the operation of delay apparatus 41 concisely.

In the fourth embodiment, a cycle time of the clock pulse signal C is set at 50 ns., and the delay period of time T is set at 500 ns. In this case, the number of the clock pulse signals C corresponding to the delay period of time T is equal to "10". In FIG. 7, the decoder 56 outputs the value "10". The second initial value is set at the value added one to the value of the output of the decoder 56, which is equal to "11". Therefore, the read counter 54 sets the read count value RD at "11" in response to the system reset signal RST.

In the fourth embodiment, the digital signal A has a variable period of time while the digital signal maintains the second logic level.

As shown in FIG. 7, the digital signal A is input to the rising edge detection circuit 42 via the input terminal 2, and is synchronized with the clock pulse signal C.

At time t41 shown in FIG. 8, the system reset signal RST is input to the delay apparatus 41 before beginning of the operation of the delay apparatus 41. The write address counter 46 resets the value of the write address WA at "0" in response to the system reset signal RST. At the same time, the write counter 51 resets the write count value WD at "0". The read address counter 52 resets the value of the read address RA at "0". The read counter 54 resets the read count value at the second initial value, that is, "11". The judgement circuit 58 stores the value "10" of the output signal from the decoder 56. The judgement circuit 58 sets the value of the output signal S at "1", since the stored value "10" is not "0", that is, the delay period of time is set.

At the time t41, the selector 48 selects and outputs the least significant bit (LSB) of the read address RA, wherein the output signal is indicated by symbol B in FIG. 8. In this time, the value of the output signal B is "0", since the LSB of the read address RA is "0".

After the time t41, in the storage circuit 47, in response to the clock pulse signal C, the write count value WD from write counter 51 is repeatedly written into the storage circuit 47 at the address corresponding to the write address WA ("0"). Furthermore, in the storage circuit 47, in response to the clock pulse signal C, the write count value WD stored at the address corresponding to the read address RA ("0") is repeatedly read out. The read out write count value WD from the storage circuit 47 is input to the comparator 53. The comparator 53 compares the write count value WD read out from the storage circuit 47 with the read count value RD from a read counter 54.

At time t42, if the logic level of the digital signal A changes from "0" to "1", the rising edge detection circuit 42 outputs the rising edge of the synchronized digital signal A as the edge detection signal D. The OR circuit 44 outputs the output signal K in response to the edge detection signal D. The write address counter 46 increments a write address WA from "0" to "1" in response to the output signal K. As a result the write address WA is incremented, the storage circuit 47 changes the address where the write count value WD is wrote from "0" to "1". In the storage circuit 47, in response to the clock pulse signal C, the write count value WD from write counter 51 is repeatedly written into the storage circuit 47 at the address corresponding to the write address WA ("1").

At a time t43, if the logic level of the digital signal A changes from "1" to "0", the falling edge detection circuit 43 outputs the edge detection signal D'. The OR circuit 44 outputs the output signal K in response to the edge detection signal D'. The write address counter 46 increments a write address WA from "1" to "2" in response to the output signal K. As a result the write address WA is incremented, the storage circuit 47 changes the address where the write count value WD is wrote from "1" to "2". In the storage circuit 47, in response to the clock pulse signal C, the write count value WD from write counter 51 is repeatedly written into the storage circuit 47 at the address corresponding to the write address WA ("2").

At a time t44, the comparator 53 outputs the output signal E, since the write count value WD read out from the storage circuit 47 at address "0" equals to the read count value RD from a read counter 54. The read address counter 52 increments the value of the read address RA from "0" to "1" in response to the output signal E. The selector 48 selects and outputs the least significant bit (LSB) of the read address RA. The value of the output signal B is changed from "0" to "1". This time t44 when the digital signal B rises is delayed for a period of time corresponding to the ten clock pulse signals C from the time t42 when the digital signal A rises. Therefor, the time t44 is delayed for the predetermined delay period of time from the time t42, which is equal to 500 ns. After the time t44, the comparator 53 compares the write count value WD read out from the storage circuit 47 at address "1" with the read count value RD from the read counter 54.

At a time t45, if the digital signal A changes the logic level from "0" to "1" once more, the rising edge detection circuit 42 outputs the edge detection signal D. The OR circuit 44 outputs the output signal K. The write address counter 46 increments the write address WA from "2" to "3" in response to the output signal K of the OR circuit. The storage circuit 47 changes the address where the write count value WD is wrote from "2" to "3". In the storage circuit 47, the write count value WD from write counter 51 is repeatedly written into the storage circuit 47 at the address corresponding to the write address WA ("3") after the time t45.

At the time t45, the comparator 53 outputs the output signal E, since the write count value WD read out from the storage circuit 47 at address "1" equals to the read count value RD from the read counter 54. The read address counter 52 increments the value of the read address RA from "1" to "2" in response to the output signal E. The selector 48 selects and outputs the least significant bit (LSB) of the read address RA. The value of the output signal B is changed from "1" to "0". This time t45 when the digital signal B falls is delayed for a period of time corresponding to the ten clock pulse signals C from the time t43 when the digital signal A falls. Therefor, the time t45 is delayed for the predetermined delay period of time from the time t43, which is equal to 500 ns. After the time t45, the comparator 53 compares the write count value WD read out from the storage circuit 47 at address "2" with a read count value RD.

At a time t46, if the logic level of the digital signal A changes from "1" to "0", the falling edge detection circuit 43 outputs the edge detection signal D'. The OR circuit 44 outputs the output signal K. The write address counter 46 increments an write address WA from "3" in response to the output signal K. Because the write address counter 46 uses a 2-bit counter, for practical purposes, the write address WA is changed from "3" to "0". The storage circuit 47 changes the address where the write count value WD is wrote from "3" to "0". In the storage circuit 47, the write count value WD from write counter 51 is repeatedly written into the storage circuit 47 at the address corresponding to the write address WA ("0") after the time t46.

At a time t47, the comparator 53 outputs the output signal E, since the write count value WD read out from the storage circuit 47 at address "2" equals to the read count value RD of a read counter 54. The read address counter 52 increments the value of the read address RA from "2" to "3" in response to the output signal E. The selector 48 selects and outputs the least significantbit (LSB) of the readaddress RA. Therefor, the value of the output signal B is changed from "0" to "1". This time t47 when the digital signal B rises is delayed for a period of time corresponding to the ten clock pulse signals C from the time t45 when the digital signal A rises. Therefor, the time t47 is delayed for the predetermined delay period of time from the time t45, which is equal to 500 ns. After the time t47, the comparator 53 compares the write count value WD read out from the storage circuit 47 at address "3" with a read count value RD from the read counter 54.

The logic level of the digital signal A changes from "0" to "1" at the time t48, and changes from "1" to "0" at the time t49. In this case, the delay apparatus 41 repeats the operation in the same manner as the operation at the time t42, t43, t45, and t46.

At the time t410, the comparator 53 outputs the output signal E, since the write count value WD read out from the storage circuit 47 at address "3" equals to the read count value RD from the read counter 54. The read address counter 52 increments the read address RA from "3" in response to the output signal K. Because the read address counter 52 uses a 2-bit counter, for practical purposes, the read address RA is changed from "3" to "0". The selector 48 selects and outputs the least significant bit (LSB) of the read address RA. Therefor, the value of the output signal B is changed from "1" to "0". This time t410 when the digital signal B falls is delayed for a period of time corresponding to the ten clock pulse signals C from the time t46 when the digital signal A falls. Therefor, the time t410 is delayed for the predetermined delay period of time from the time t46, which is equal to 500 ns. After the time t410, the comparator 53 compares the write count value WD read out from the storage circuit 47 at address "0" with a read count value RD. After the time t410, the delay apparatus 41 repeats the same operation described above in accordance with the change of the level of the digital signal A until the system reset signal RST is input.

In the case the delay period of time T is not set, that is, the delay period of time is not determined, the decoder 56 outputs the value "0". The judgement circuit 58 outputs the output signal S set at "0" to the selector 48 when the system reset signal RST is input. The selector 48 selects the least significant bit (LSB) of the write address WA in accordance with the output signal S. As shown in FIG. 8, the write address WA is incremented synchronously with every edge of the digital signal A. Therefor, the output signal B from the selector 48 is synchronized with every edge of the digital signal A. The logic level of the output signal B is same as the logic level of the digital signal A.

As described above, in the fourth embodiment, the delay apparatus 41 can delay the digital signal A which has a variable period of time while the second logic level is maintained for the predetermined delay period of time T. And the delay apparatus 41 can output the digital signal B the period of time while which maintains the second level is equal to the period of time while the digital signal A maintains the second level. Furthermore, in the delay apparatus 41, the delay period of time T can be set at the greater value than the period of time while the digital signal A maintains the second level. Hence, the delay apparatus 41 is useful for delaying the digital signal A for the greater period of time than the period of time while the digital signal A maintains the second level.

Other Embodiments

The preferred embodiments of the present invention have been described above in detail, but the present invention is not limited to the above-described embodiments, and can variously be modified in the scope of the present invention described in claims. The other embodiments of the present invention will next be described.

(1) In the first embodiment, in the same manner as the second and third embodiments, the frequency demultiplier 22 can be disposed between the input terminal 3 and the counter 5. On the other hand, in the second and third embodiments, the frequency demultiplier 22 can be omitted.

(2) In every embodiment, the delay period of time T can be set at various values in accordance with various conditions.

What is claimed is:

1. An apparatus for delaying a digital signal for a predetermined delay period of time, the digital signal having first and second logic levels, comprising:
   a first edge detection circuit which detects a first edge of the digital signal whereon the level of the digital signal changes from the first logic level to the second logic level, and generates a first detection signal;
   a set circuit which includes a first counter for counting a reference clock signal to generate a count value and clearing the count value in response to the first detection signal, wherein the set circuit generates a set signal if the count value reaches the number of the reference clock signals corresponding to the delay period of time;
   a reset circuit which generates a reset signal if an elapsed period of time since a generation of the set signal equals a period of time the digital signal maintains the second logic level; and
   an output circuit which outputs a delayed digital signal including edges synchronized with the set signal and the reset signal.

2. The apparatus of claim 1, wherein the reset circuit comprises:
   a first storage circuit which stores the number of reference clock signals corresponding to the period of time the digital signal maintains the second logic level; and
   a first comparator which compares the count value of the first counter with a sum of the number of the references clock signals corresponding to the delay period of time and the number of reference clock signals corresponding to the period of time the digital signal maintains the second logic level, and generates the reset signal if the count value of the first counter equals the sum.

3. The apparatus of claim 1, wherein the apparatus further comprises:
   a second edge detection circuit which detects a second edge of the digital signal whereon the level of the digital signal changes from the second logic level to the first logic level, and generates a second detection signal;
   and wherein the reset circuit comprises:
   a second storage circuit which stores the count value of the first counter in response to the second edge detection signal;
   a second counter which counts the reference clock signal to generate a count value and clears the count value of the second counter in response to the set signal; and
   a second comparator which compares the count value of the second counter with the count value stored by the second storage circuit, and generates the reset signal if the count value of the second counter equals the count value stored by the second storage circuit.

4. The apparatus of claim 1, wherein the apparatus further comprises:
   a second edge detection circuit which detects a second edge of the digital signal whereon the level of the digital signal changes from the second logic level to the first logic level, and generates a second detection signal;
   and wherein the reset circuit comprises:
   a third counter which counts the reference clock signal to generate a count value and clears the count value of the third counter in response to the second detection signal; and
   a third comparator which compares the count value of the third counter with the number of the reference clock signals corresponding to the delay period of time, and generates the reset signal if the count value of the third counter equals the number of the reference clock signals corresponding to the delay period of time.

5. An apparatus for delaying a digital signal for a predetermined delay period of time, the digital signal having first and second logic levels, comprising:
   an edge detection circuit which detects a first edge of the digital signal and a second edge of the digital signal, wherein on the first edge the level of the digital signal changes from the first logic level to the second logic level, wherein on the second edge the level of the digital signal changes from the second logic level to the first logic level, and generates a detection signal;
   a write address counter which changes a write address value in response to the edge detection signal, and clears the write address value in response to a system reset signal;
   a write counter which counts a reference clock signal to generate a write count value, and resets the write count value at a first initial value in response to the system reset signal;
   a storage circuit which stores the write count value, wherein the write count value is written into the storage circuit in accordance with the write address value and read out from the storage circuit in accordance with the read address value;
   a read counter which counts the reference clock signals to generate a read count value, and resets the read count value at a second initial value in response to the system reset signal, wherein the second initial value is equal to the difference of a value obtained by adding one to the number of the reference clock signals corresponding to the delay period of time from the first initial value;
   a comparator which compares the read count value with the write count value read out from the storage circuit, and generates a detection signal if the read count value equals the write count value read out from the storage circuit;
   a read address counter which changes the read address value in response to the detection signal of the comparator, and clears the read address value in response to a system reset signal; and
   an output circuit which outputs the least significant bit of the read address value.

6. The apparatus of claim 5, wherein the apparatus further comprises:
   a judgment circuit which judges whether the delay period of time is set or not based on the second initial value;

and wherein the output circuit outputs the least significant bit of the write address value if the delay period of time is not set.

7. A method for delaying a digital signal for a predetermined delay period of time, the digital signal having first and second logic levels, comprising the steps of:

(A) detecting a first edge of the digital signal whereon the level of the digital signal changes from the first logic level to the second logic level, and generating a first detection signal;

(B) counting a reference clock signal to output a count value and clearing the count value in response to the first detection signal, and generating a set signal if the count value reaches the number of the reference clock signals corresponding to the delay period of time;

(C) generating a reset signal if an elapsed period of time since a generation of the set signal equals a period of time the digital signal maintains the second logic level; and (D) outputting a pulse signal including edges synchronized with the set signal and the reset signal.

8. The method of claim 7, wherein the step (C) comprises the substeps of:

(c1) storing the number of reference clock signals corresponding to the period of time the digital signal maintains the second logic level; and (c2) comparing the count value of counted in the step (B) with a sum of the number of the reference clock signals corresponding to the delay period of time and the number of reference clock signals corresponding to the period of time the digital signal maintains the second logic level, and generating the reset signal if the count value counted in the step (B) equals the sum.

9. The method of claim 7, wherein the method further comprises the step of:

(E) detecting a second edge of the digital signal whereon the level of the digital signal changes from the second logic level to the first logic level, and generating a second detection signal;

and wherein the step (C) comprises the substeps of:

(c3) storing the count value counted in the step (B) in response to the second edge detection signal;

(c4) counting the reference clock signals to generate a count value and clearing the count value in response to the set signal; and (c5) comparing the count value counted in the substep (c4) with the stored count value, and generating the reset signal if the count value counted in the substep (c4) equals the stored count value.

10. The method apparatus of claim 7, wherein the method further comprises the step of:

(F) detecting a second edge of the digital signal whereon the level of the digital signal changes from the second logic level to the first logic level, and generating a second detection signal;

and wherein the step (C) comprises the substeps of:

(c6) counting the reference clock signal to generate a count value and clearing the count value in response to the second detection signal; and (c7) comparing the count value counted in the substep (c6) with the number of the reference clock signals corresponding to the delay period of time, and generating the reset signal if the count value counted in the substep (c6) equals the number of the reference clock signals corresponding to the delay period of time.

11. A method for delaying a digital signal for a predetermined delay period of time, the digital signal having a first and a second logic levels, comprising the steps of:

detecting a first edge of the digital signal and a second edge of the digital signal, wherein on the first edge the level of the digital signal changes from the first logic level to the second logic level, wherein on the second edge the level of the digital signal changes from the second logic level to the first logic level, and generating a detection signal;

changing a write address value in response to the edge detection signal, and clearing the write address value in response to a system reset signal;

counting a reference clock signal to output a write count value, and resetting the write count value at a first initial value in response to the system reset signal;

storing the write count value, wherein the write count value is written into the storage circuit in accordance with the write address value and read out from the storage circuit in accordance with the read address value;

counting the reference clock signal to output a read count value, and resetting the read count value at a second initial value in response to the system reset signal, wherein the second initial value is equal to the difference of a value obtained by adding one to the number of the reference clock signals corresponding to the delay period of time from the first initial value;

comparing the read count value with the write count value read out in the storing the write count value step, and generating a detection signal if the read count value equals the write count value read out in the storing the write count value step;

changing the read address value in response to the detection signal, and clearing the read address value in response to a system reset signal; and outputting the least significant bit of the read address value.

12. The method of claim 11, wherein the method further comprises the steps of:

judging whether the delay period of time is set or not based on the second initial value;

and wherein the step of outputting the least significant bit outputs the least significant bit of the write address value if the delay period of time is not set.

13. An apparatus for delaying a digital signal for a predetermined delay period of time, the digital signal having a first and a second logic levels, comprising:

a first edge detection means for detecting a first edge of the digital signal whereon the level of the digital signal changes from the first logic level to the second logic level, and generating a first detection signal;

a set means, which includes a first counter for counting a reference clock signal to generate a count value and clearing the count value in response to the first detection signal, wherein the set means generates a set signal if the count value reaches the number of the reference clock signals corresponding to the delay period of time;

a reset means for generating a reset signal if an elapsed period of time since a generation of the set signal equals a period of time the digital signal maintains the second logic level; and an output means for outputting a pulse signal including edges synchronized with the set signal and the reset signal.

14. The apparatus of claim 13, wherein the reset means comprises:
- a first storage means for storing the number of reference clock signals corresponding to the period of time the digital signal maintains the second logic level; and
- a first comparing means for comparing the count value of the first counter with a sum of the number of the references clock signal corresponding to the delay period of time and the number of reference clock signals corresponding to the period of time the digital signal maintains the second logic level, and generating the reset signal if the count value of the first counter equals the sum.

15. The apparatus of claim 13, wherein the apparatus further comprises:
- a second edge detection means for detecting a second edge of the digital signal whereon the level of the digital signal changes from the second logic level to the first logic level, and generating a second detection signal;

and wherein the reset means comprises:
- a second storage means for storing the count value of the first counter in response to the second edge detection signal;
- a second counter which counts the reference clock signal to generate a count value and clearing the count value in response to the set signal; and
- a second comparing means for comparing the count value of the second counter with the count value stored by the second storage means, and generating the reset signal if the count value of the second counter equals the count value stored by the second storage means.

16. The apparatus of claim 13, wherein the apparatus further comprises:
- a second edge detection means for detecting a second edge of the digital signal whereon the level of the digital signal changes from the second logic level to the first logic level, and generating a second detection signal;

and wherein the reset means comprises:
- a third counter which counts the reference clock signal to generate a count value and clearing the count value in response to the second detection signal; and
- a third comparing means for comparing the count value of the third counter with the number of the reference clock signals corresponding to the delay period of time, and generating the reset signal if the count value of the third counter equals the number of the reference clock signals corresponding to the delay period of time.

17. An apparatus for delaying a digital signal for a predetermined delay period of time, the digital signal having first and second logic levels, comprising:
- an edge detection means for detecting a first edge of the digital signal and a second edge of the digital signal, wherein on the first edge the level of the digital signal changes from the first logic level to the second logic level, wherein on the second edge the level of the digital signal changes from the second logic level to the first logic level, and generating a detection signal;
- a write address count means for changing a write address value in response to the edge detection signal, and clearing the write address value in response to a system reset signal;
- a write count means for counting a reference clock signal to generate a write count value, and resetting the write count value at a first initial value in response to the system reset signal;
- a storage means for storing the write count value, wherein the write count value is written into the storage circuit in accordance with the write address value and read out from the storage circuit in accordance with the read address value;
- a read count means for counting the reference clock signal to generate a read count value, and resetting the read count value at a second initial value in response to the system reset signal, wherein the second initial value is equal to the difference of a value obtained by adding one to the number of the reference clock signals corresponding to the delay period of time from the first initial value;
- a comparing means for comparing the read count value with the write count value read out from the storage means, and generating a detection signal if the read count value equals the write count value read out from the storage means;
- a read address count means for changing the read address value in response to the detection signal, and clearing the read address value in response to a system reset signal; and
- an output means for outputting the least significant bit of the read address value.

18. The apparatus of claim 17, wherein the apparatus further comprises:
- a judgment means for judging whether the delay period of time is set or not based on the second initial value;

and wherein the output means for outputting outputs the least significant bit of the write address value if the delay period of time is not set.

* * * * *